United States Patent
Sung et al.

(10) Patent No.: US 9,553,106 B1
(45) Date of Patent: Jan. 24, 2017

(54) THREE-DIMENSIONAL NONVOLATILE MEMORY DEVICE

(71) Applicant: SK hynix Inc., Icheon-si Gyeonggi-do (KR)

(72) Inventors: Sang Hyun Sung, Cheongju-si (KR); Jeong Hwan Kim, Yeoju-si (KR); Jin Ho Kim, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 15/047,748

(22) Filed: Feb. 19, 2016

(30) Foreign Application Priority Data

Nov. 5, 2015 (KR) ........................ 10-2015-0154879

(51) Int. Cl.
*H01L 27/115* (2006.01)
*H01L 23/528* (2006.01)
*H01L 23/522* (2006.01)

(52) U.S. Cl.
CPC ....... *H01L 27/11582* (2013.01); *H01L 23/528* (2013.01); *H01L 23/5226* (2013.01); *H01L 27/11573* (2013.01)

(58) Field of Classification Search
CPC ...... H01L 27/1128; H01L 27/11578–27/11582
See application file for complete search history.

(56) References Cited

U.S. PATENT DOCUMENTS

| 8,729,624 B2 | 5/2014 | Fukuzumi et al. | |
| 2009/0020744 A1* | 1/2009 | Mizukami | H01L 27/11578 257/4 |
| 2012/0211823 A1* | 8/2012 | Lim | H01L 27/11565 257/326 |
| 2014/0061766 A1* | 3/2014 | Kito | H01L 27/11565 257/324 |
| 2016/0111361 A1* | 4/2016 | Oh | H01L 27/11548 257/390 |

FOREIGN PATENT DOCUMENTS

KR    1020160096309 A    8/2016

* cited by examiner

*Primary Examiner* — Bryan Junge
(74) *Attorney, Agent, or Firm* — William Park & Associates Ltd.

(57) ABSTRACT

A three-dimensional nonvolatile memory device includes a substrate defined with a slimming region, first and second pass regions on both sides of the slimming region, and a cell region adjacent to the slimming region with the first pass region interposed therebetween; a word line stack including a plurality of word lines stacked over the cell region, the first pass region, and the slimming region of the substrate; first wiring lines extending from the slimming region to the first pass region and electrically coupling some word lines with pass transistors formed in the first pass region of the substrate; and second wiring lines extending from the slimming region to the second pass region and electrically coupling remaining word lines, other than the some word lines, with pass transistors formed in the second pass region of the substrate.

20 Claims, 9 Drawing Sheets

THREE-DIMENSIONAL NONVOLATILE MEMORY DEVICE

CROSS-REFERENCES TO RELATED APPLICATION

The present application claims priority under 35 U.S.C. 119(a) to Korean Patent Application Number 10-2015-0154879 filed in the Korean Intellectual Property Office on Nov. 5, 2015, which is incorporated herein by reference in its entirety.

BACKGROUND

1. Technical Field

Various embodiments generally relate to a semiconductor technology, and more particularly, to a three-dimensional nonvolatile memory device.

2. Related Art

Because two-dimensional nonvolatile memory devices have reached a limit in terms of memory cells formed in a single layer on a substrate, a three-dimensional nonvolatile memory device in which memory cells are arranged three-dimensionally on a substrate so as to enhance the degree of integration has been proposed.

In the three-dimensional nonvolatile memory device, a desired memory cell is operated by applying bias to corresponding word lines which are stacked on the substrate, forming a multi-layer structure. For this to occur, pad portions are formed on the respective word lines in a slimming region. Through contact plugs, the pad portions of the word lines are electrically coupled to wiring lines lying over the pad portions.

SUMMARY

In an embodiment, a three-dimensional nonvolatile memory device includes: a substrate defined with a slimming region, first and second pass regions on both sides of the slimming region, and a cell region adjacent to the slimming region with the first pass region interposed therebetween; a word line stack including a plurality of word lines stacked over the cell region, the first pass region, and the slimming region of the substrate; first wiring lines extending from the slimming region to the first pass region and electrically coupling some of the word lines with pass transistors formed in the first pass region of the substrate; and second wiring lines extending from the slimming region to the second pass region and electrically coupling remaining ones of the word lines, other than the some word lines, with pass transistors formed in the second pass region of the substrate.

BRIEF DESCRIPTION OF THE DRAWINGS

In the drawing figures, dimensions may be exaggerated for clarity of illustration. It will be understood that when an element is referred to as being "between" two elements, the element may be the only element between the two elements, or one or more intervening elements may also be present. Like reference numerals refer to like elements throughout.

DETAILED DESCRIPTION

Hereinafter, a three-dimensional nonvolatile memory device will be described below with reference to the accompanying drawings through various examples of embodiments.

Figure 1:
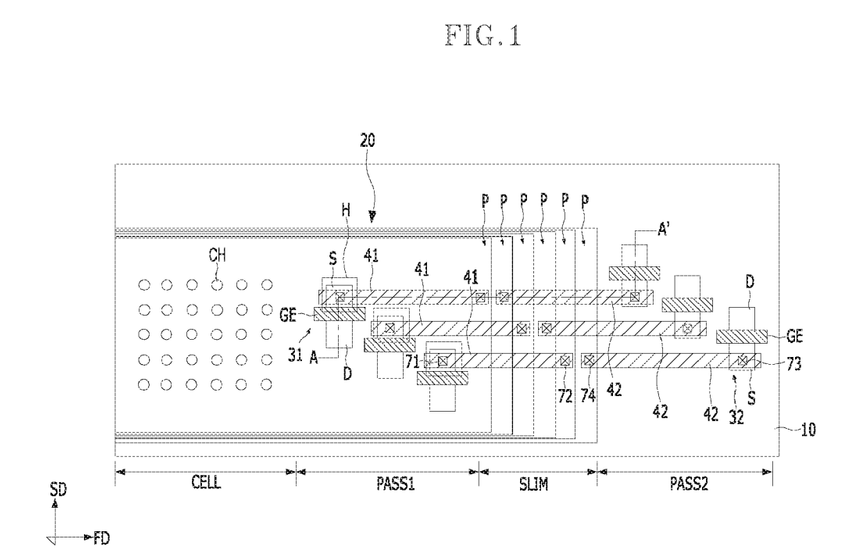
FIG. 1 is a plan view illustrating a three-dimensional nonvolatile memory device in accordance with an embodiment.
Figure 2:
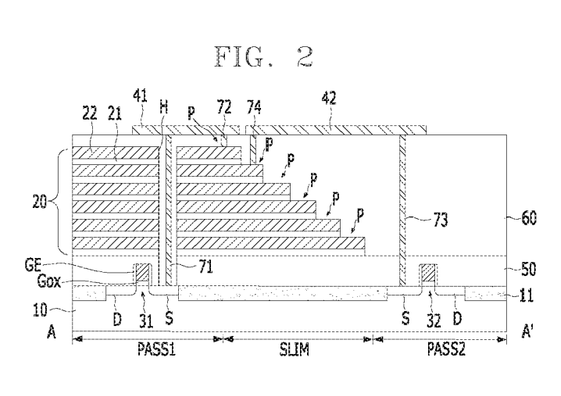
FIG. 2 is a sectional view taken along line A-A' of FIG. 1.

Referring to FIGS. 1 and 2, a three-dimensional nonvolatile memory device in accordance with an embodiment may include a substrate 10, a word line stack 20, and pass transistors 31 and 32. The three-dimensional nonvolatile memory device in accordance with the embodiment may further include a plurality of wiring lines 41 and 42.

The substrate 10 may be a silicon (Si) substrate, a germanium (Ge) substrate, a silicon-germanium (SiGe) substrate, an SOI (Silicon-On-Insulator) substrate, or an SGOI (Silicon-Germanium-Insulator) substrate. The substrate 10 may include a structure such as an isolation layer 11 defining an active region.

The substrate 10 may include a cell region CELL, a slimming region SLIM, a first pass region PASS1, and a second pass region PASS2.

The cell region CELL, the first pass region PASS1, the slimming region SLIM, and the second pass region PASS2 may be arranged along a first direction FD defined in FIG. 1. That is, the slimming region SLIM may be disposed between the first pass region PASS1 and the second pass region PASS2. The cell region CELL may be disposed adjacent to the slimming region SLIM with the first pass region PASS1 interposed therebetween.

The word line stack 20 may be formed on the cell region CELL, the first pass region PASS1 and the slimming region SLIM of the substrate 10 and include dielectric layers 21 and word lines 22 that are alternately stacked.

The word line stack 20 may be provided to correspond to a unit memory block. Although not shown, a plurality of word line stacks (similar to the word line stack 20), corresponding to a plurality of memory blocks, may be formed on the substrate 10. The plurality of word line stacks (not shown) may be arranged in a second direction SD perpendicular to the first direction FD. The first direction FD may be a longitudinal direction of the memory block. The second direction SD may be a widthwise direction of the memory block.

The word line stack 20 may extend from the cell region CELL toward the first pass region PASS1 in the first direction FD and expand to the slimming region SLIM via the first pass region PASS1. A channel layer CH passing through the word line stack 20 may be formed in the cell region CELL.

Although not shown, a cell string may be formed in the cell region CELL, the cell string including at least one drain select transistor, memory cells and at least one source select transistor which are formed along the channel layer CH. The word lines 22 included in the word line stack 20 may be respectively coupled to control gates of the memory cells. The structure of the cell string will be described later with reference to FIGS. 6 and 7.

A pad portion P may be formed on each of the word lines 22 in the slimming region SLIM, allowing the pad portion P couple each of the word lines 22 with a corresponding contact plug. The pad portion P may be an exposed, top portion of the word line 22 (of the word line stack 20), which is not covered by another word line above said word line.

Figure 3:
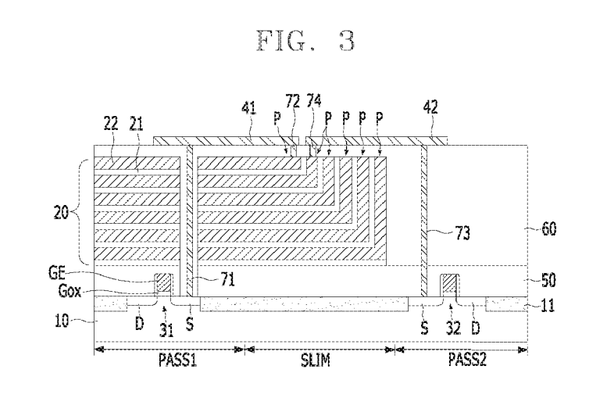
FIG. 3 is a sectional view illustrating a three-dimensional nonvolatile memory device in accordance with an embodiment.

As shown in FIG. 2, the pad portions P may be formed by patterning the word lines 22 such that ends of the word lines 22 are exposed, creating a stepped form in the slimming region SLIM. Alternatively, as shown in FIG. 3, the pad portions P may be formed by protruding the ends of the word lines 22 upwards to an upper portion of the word line stack 20 in the slimming region SLIM.

Referring again to FIGS. 1 and 2, the pass transistors 31 and 32 may be formed on the first pass region PASS1 and the second pass region PASS2 of the substrate 10. Hereinafter, for the sake of description, a pass transistor formed in the first pass region PASS1 will be designated as a first pass transistor 31, and a pass transistor formed in the second pass region PASS2 will be designated as a second pass transistor 32.

Each of the first and second pass transistors 31 and 32 may include a gate dielectric layer Gox, a gate electrode GE, a source S, and a drain D. The gate dielectric layer Gox may be formed of a silicon oxide layer and may include a gate dielectric layer for high voltages. The gate electrode GE may have a single layer structure formed of doped silicon or a stacked structure of doped silicon and a metal compound. The metal compound may include metal silicide. The source S and the drain D may be N-type or P-type impurity regions and may be formed on the substrate 10 on both sides of the gate electrode GE.

A first interlayer dielectric layer 50 covers the first and second pass transistors 31 and 32 and may be formed on the substrate 10. The word line stack 20 may be disposed on the first interlayer dielectric layer 50.

The wiring lines 41 and 42 may include first wiring lines 41 which extend from the slimming region SLIM to the first pass region PASS1, and second wiring lines 42 which extend from the slimming region SLIM to the second pass region PASS2.

The first wiring lines 41 and the second wiring lines 42 may be disposed on the same layer. Each of the second wiring lines 42 may have a same width as each of the first wiring lines 41. Each of spaces between the adjacent second wiring lines 42 may have a same width as each of the spaces between the first wiring lines 41.

In the present embodiment, a second interlayer dielectric layer 60 that covers the word line stack 20 may be formed on the first interlayer dielectric layer 50. The first and second wiring lines 41 and 42 may be disposed on the second interlayer dielectric layer 60.

The first wiring lines 41 may be electrically coupled with the sources S of the first pass transistors 31 through first contact plugs 71 which are formed in the first pass region PASS1 in a direction perpendicular to a top surface of the substrate 10. The first wiring lines 41 may also be electrically coupled with the pad portions P of some of the word lines 22 through second contact plugs 72 which are formed in the slimming region SLIM in the direction perpendicular to the top surface of the substrate 10. Likewise, the second wiring lines 42 may be electrically coupled with the sources S of the second pass transistors 32 through third contact plugs 73 which are formed in the second pass region PASS2 in the direction perpendicular to the top surface of the substrate 10. The second wiring lines 42 may also be electrically coupled with the pad portions P of the other word lines 22 (word lines that are not the "some of the word lines 22" disclosed above) through fourth contact plugs 74 which are formed in the slimming region SLIM in the direction perpendicular to the top surface of the substrate 10.

The some word lines 22 that are coupled with the first wiring lines 41 may be word lines that are disposed on even number-th layers. The other word lines 22 that are coupled with the second wiring lines 42 may be word lines that are disposed on odd number-th layers.

In the present embodiment, as the slimming region SLIM is disposed between the first pass region PASS1 and the second pass region PASS2, the wiring lines 41 and 42 which electrically couples the pad portions P of the slimming region SLIM with the pass transistors 31 and 32 that are formed in the first and second pass regions PASS1 and PASS2, respectively. Due to the location of the pass transistors 31 and 32, the wiring lines 41 and 42 can be routed in such a way that the wiring lines 41 and 42 are dispersed toward both left and right sides of the slimming region SLIM. In contrast, when the slimming region is disposed at one side of the pass transistors (and not in between the pass transistors as in the embodiment), the wiring lines which electrically couple the pass transistors with the pad portions of the slimming region are routed toward only one side toward the pass transistors. Therefore, the current embodiment allows for the number of wiring lines arranged in the second direction SD, that is, in the widthwise direction of the memory block, to be reduced. Consequently, the width of the memory block can be reduced, whereby the size of the memory device can be reduced. In other words, with the current configuration of six word line layers disclosed in FIG. 1, the current embodiment requires only the width of three wiring lines. On the other hand, the prior art, explained above, requires the width of six wiring lines.

To minimize the width of the memory block, there is the need to minimize the number of wiring lines 41 and 42 arranged in the second direction SD. As explained, the embodiment utilizes pass transistors on both sides of the slimming region SLIM to allow for wiring lines to couple the pad portions of the slimming region to the pass transistors on both sides. For this, in the case where the number of wiring lines 41 and 42 is even, the first wiring lines 41 and the second wiring lines 42 may be configured with the same number. In the case where the number of wiring lines 41 and 42 is odd, the number of first wiring lines 41 may be greater or less than that of the second wiring lines 42 by one. Furthermore, the first wiring lines 41 and the second wiring lines 42 may be respectively paired with each other. Each pair of first and second wiring lines 41 and 42 may be disposed on the same line.

The word line stack 20 may have through holes H corresponding to each of the first contact plugs 71 in the first pass region PASS1 so as to avoid an electrical short circuit with the first contact plugs 71. The first contact plugs 71 may be disposed in the through holes H.

Although the embodiment described in FIGS. 1 and 2 disclose the through holes H formed in the word line stack 20 with the first contact plugs 71 disposed in the through holes H, the present disclosure is not limited to this and may be modified in various forms to prevent an electrical short circuit.

Figure 4:
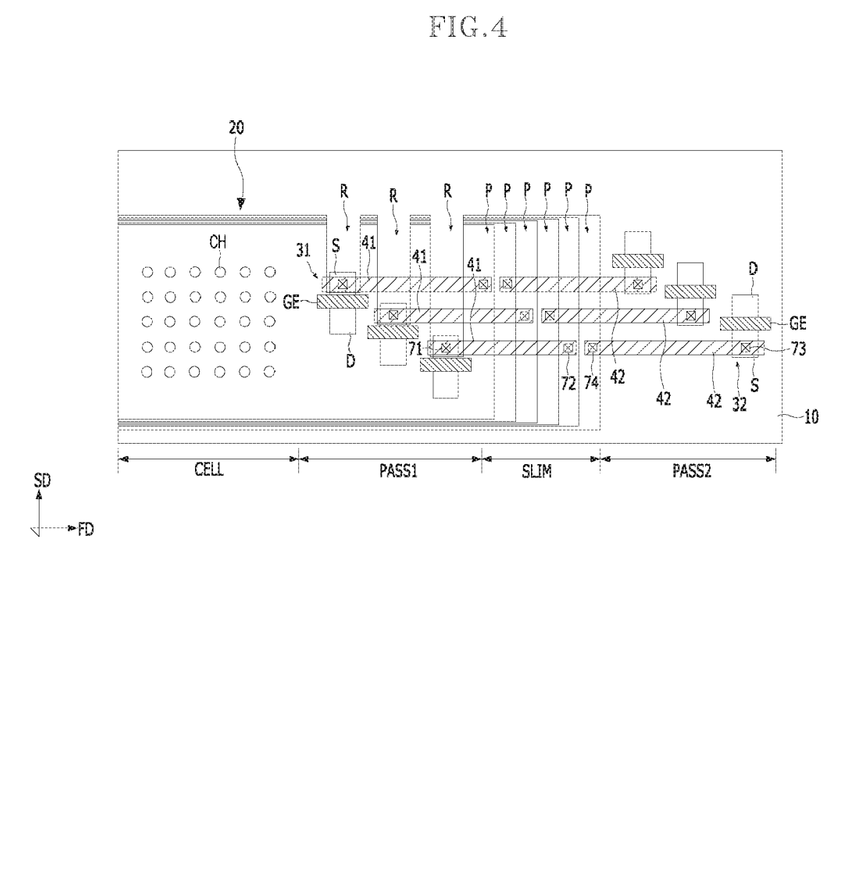
FIGS. 4 and 5 are plan views illustrating a three-dimensional nonvolatile memory device in accordance with an embodiment.
Figure 5:
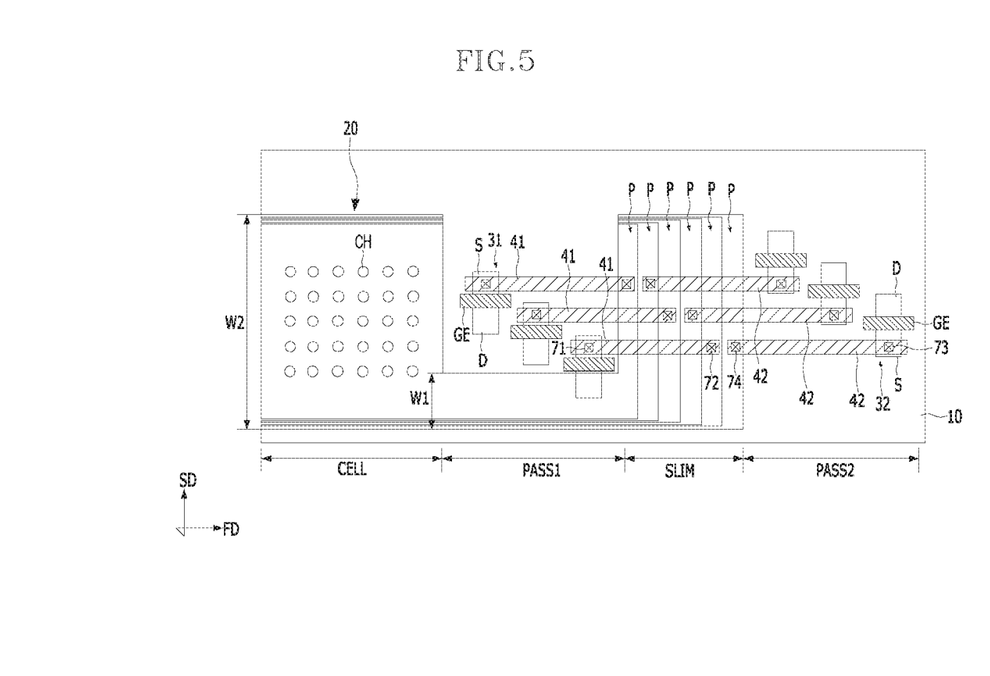

For example, as shown in FIG. 4, the word line stack 20 may have, in a side surface thereof, a plurality of recesses R, each corresponding to each of the first contact plugs 71. Each of the first contact plugs 71 may be disposed in its respective recesses R. Alternatively, as shown in FIG. 5, the word line stack 20 may have, in a side surface thereof, a recess R corresponding to the first pass region PASS1 such that the word line stack 20 has a reduced width in the first pass region PASS1 compared to that in the cell region CELL or the slimming region SLIM. For example, for the embodiment shown in FIG. 5, when the width of the word line stack 20 in the first pass region PASS1 is considered to be W1 and the width of the word line stack 20 in the cell region CELL or the slimming region SLIM is considered to be W2, the mathematical relationship between W1 and W2 would be W1<W2. The first contact plugs 71 may be disposed in the recess R formed in the pass region PASS1.

Figure 6:
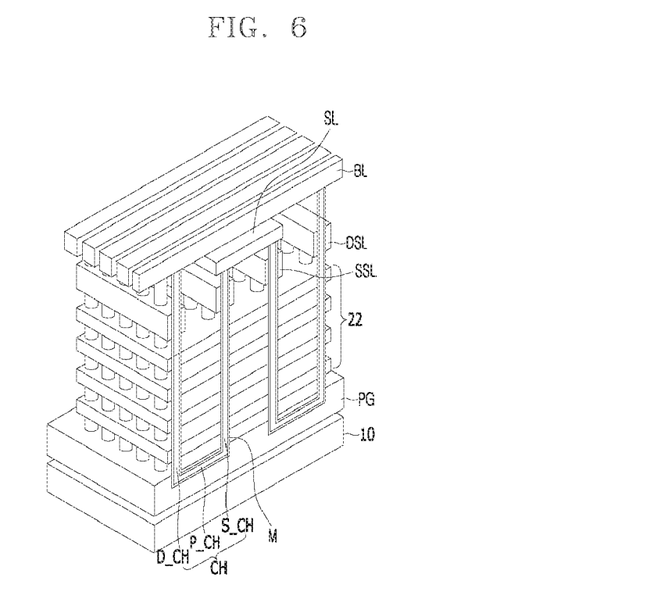
FIGS. 6 and 7 are perspective views illustrating cell structures of a three-dimensional nonvolatile memory device in accordance with an embodiment.
Figure 7:
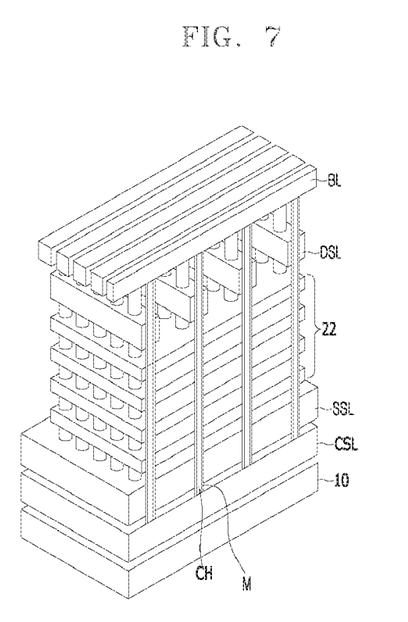

FIGS. 6 and 7 are perspective views illustrating structures of a cell string formed in the cell region CELL of the three-dimensional nonvolatile memory device in accordance with the embodiment.

In particular, FIG. 6 illustrates the case where the memory cells and the select transistors of the cell string are arranged along a U-shaped channel layer CH. FIG. 7 illustrates the case where the memory cells and the select transistors of the cell string are arranged along a linear channel layer CH.

Referring to FIG. 6, the three-dimensional nonvolatile memory device may include a pipe gate PG, word lines 22, at least one source select line SSL, and at least one drain select line DSL which are stacked on the substrate 10.

The three-dimensional nonvolatile memory device may further include a U-shaped channel layer CH, and at least one dielectric layer M which encloses the channel layer CH. The at least one dielectric layer M may include a tunnel dielectric layer, a data storage layer, and a blocking dielectric layer. The data storage layer may be formed to enclose the tunnel dielectric layer, and the blocking dielectric layer may be formed to enclose the data storage layer. The tunnel dielectric layer may include a silicon oxide layer. The data storage layer may include a silicon nitride layer which is capable of trapping a charge. The data storage layer may be disposed between the channel layer CH and the word lines 22. The blocking dielectric layer may include at least one of a silicon oxide layer and a high dielectric layer which has a dielectric permittivity higher than that of the silicon oxide layer.

The channel layer CH may include a pipe channel layer P_CH. The channel layer CH may also include a source side channel layer S_CH and a drain side channel layer D_CH which protrude from the pipe channel layer P_CH. Although FIG. 6 shows an example in which one source side channel layer S_CH and one drain side channel layer D_CH is coupled to the pipe channel layer P_CH. However, depending on the shape of the cell string, two or more source side channel layers S_CH may be coupled to the pipe channel layer P_CH, or two or more drain side channel layers D_CH may be coupled to the pipe channel layer P_CH.

The source side channel layer S_CH passes through the word lines 22 and the source select line SSL. The drain side channel layer D_CH passes through the word lines 22 and the drain select line DSL. The source side channel layer S_CH is coupled with a source line SL. The drain side channel layer D_CH is coupled with a bit line BL.

In accordance with the above-mentioned structure, at least one drain select transistor, memory cells, and at least one source select transistor, coupled in series, may form a single cell string and be arranged in a U shape.

Referring to FIG. 7, the three-dimension nonvolatile memory device may include at least one common source line CSL, a source select line SSL, word lines 22, and at least one drain select line DSL which are sequentially stacked on the substrate 10.

Each of the word lines 22 may have a planar shape. At least the source select line SSL or the drain select line DSL may have a line shape. Alternatively, the word lines 22, the source select line SSL and the drain select line DSL may have line shapes. The three-dimensional nonvolatile memory device may further include a linear channel layer CH which is coupled to the common source line CSL with at least one dielectric layer M which enclosing the channel layer CH. The at least one dielectric layer M may be formed of substantially the same material as that of the dielectric layer described with reference to FIG. 6. The channel layer CH may be coupled between the common source line CSL and the bit lines BL.

At least one drain select transistor, memory cells, and at least one source select transistor may form a single cell string and be arranged in a linear shape.

In accordance with the above-mentioned embodiments, the wiring lines that electrically couple the word lines of the slimming region with the pass transistors can be dispersed and routed toward both sides of the slimming region. Therefore, the number of wiring lines that are arranged in the widthwise direction of the memory block can be reduced. In doing so, the width of the memory block can be prevented from increasing due to the wiring lines, which prevents an increase in the overall size of the memory device.

Figure 8:
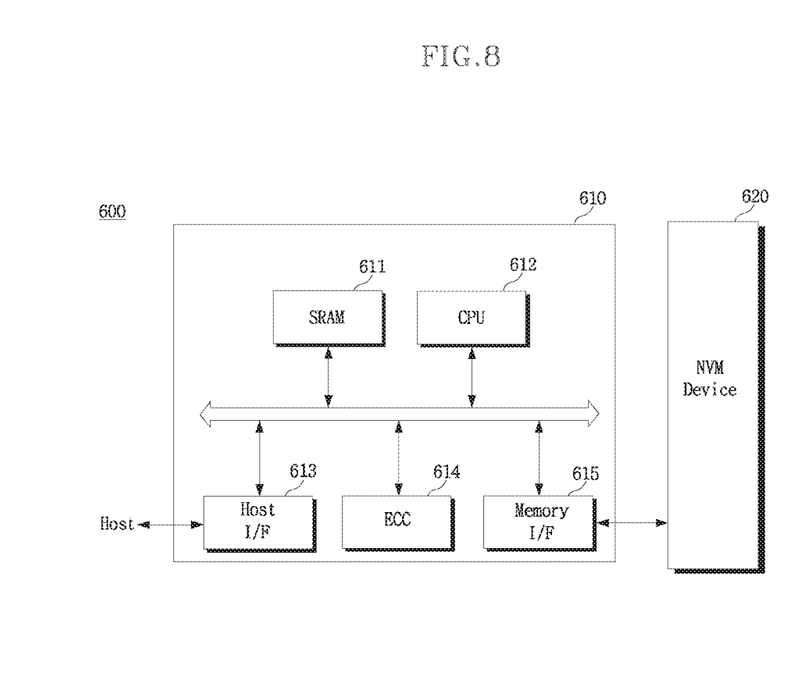
FIG. 8 is a block diagram schematically illustrating a memory system including a three-dimensional nonvolatile memory device in accordance with an embodiment.

FIG. 8 is a schematic block diagram illustrating a memory system including a three-dimension nonvolatile memory device in accordance with an embodiment.

Referring FIG. 8, a memory system 600 in accordance with an embodiment may include a nonvolatile memory device 620 and a memory controller 610.

The nonvolatile memory device 620 may include the aforementioned three-dimensional nonvolatile memory device. The memory controller 610 is configured to control the nonvolatile memory device 620. As part of either the nonvolatile memory device 620 or the memory controller 610, or the combination thereof, a memory card or a solid state disk (SSD) may be provided. An SRAM 611 is used as the working memory of a central processing unit (CPU) 612. A host interface 613 includes the data exchange protocol of a host which is coupled with the memory system 600.

An error correction code (ECC) block 614 detects and corrects an error included in the data read out from the nonvolatile memory device 620.

A memory interface 615 interfaces with the nonvolatile memory device 620. The CPU 612 performs general control operations for data exchange of the memory controller 610.

Although not shown in FIG. 8, the memory system is not limited to the specific configuration as disclosed. As is obvious to a person skilled in the art pertaining to the embodiment, the memory system 600 in accordance with the embodiment may be additionally provided with a ROM which stores code data for interfacing with the host. The nonvolatile memory device 620 may also be provided as a multi-chip package which is constructed using a plurality of flash memory chips.

The memory system 600 in accordance with the embodiment, described above, may be provided as a storage medium of high reliability, which has a low probability of an error to occur. In particular, the aforementioned semiconductor memory device may be provided for a memory system such as a solid state disk (SSD) which is being actively studied recently. In this case, the memory controller 610 may be configured to communicate with an exterior (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (Integrated Device Electronics) protocol.

Figure 9:
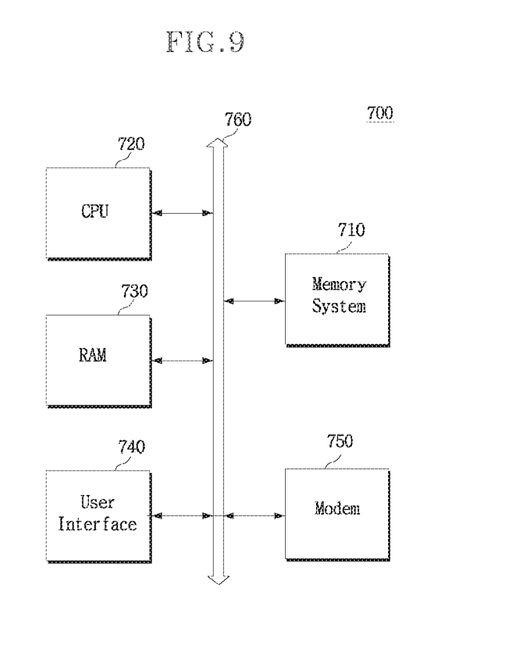
FIG. 9 is a block diagram schematically illustrating a computing system including a three-dimensional nonvolatile memory device in accordance with an embodiment.

FIG. 9 is a block diagram schematically illustrating a computing system including a three-dimensional nonvolatile memory device in accordance with an embodiment.

The computing system 700 in accordance with an embodiment may include a microprocessor 720, a RAM 730, a user interface 740, a modem 750 such as a baseband chipset, and a memory system 710, which are all electrically coupled to a system bus 760. Although not shown in FIG. 9, the computing system is not limited to the specific configuration as disclosed. In the case where the computing system 700, in accordance with the embodiment, is a mobile device, a battery (not shown) for supplying the operating voltage of the computing system 700 may be additionally provided. Furthermore, as is obvious to a person skilled in the art pertaining to the embodiment, the computing system 700 in accordance with the embodiment may be additionally provided with an application chipset, a camera image processor (CIS), a mobile DRAM, and so on. The memory system 710 may configure, for example, an SSD (solid state drive/disk) which uses a nonvolatile memory to store data. Otherwise, the memory system 710 may be provided as a fusion flash memory (for example, a OneNAND flash memory).

While various embodiments have been described above, it will be understood to those skilled in the art that the embodiments described are by way of example only. Accordingly, the three-dimensional nonvolatile memory device described herein should not be limited based on the described embodiments.

What is claimed is:

1. A three-dimensional nonvolatile memory device comprising:
   a substrate defined with a slimming region, first and second pass regions on both sides of the slimming region, and a cell region adjacent to the slimming region with the first pass region interposed therebetween;
   a word line stack including a plurality of word lines stacked over the cell region, the first pass region and the slimming region of the substrate;
   first wiring lines extending from the slimming region to the first pass region, and electrically coupling some word lines with pass transistors formed in the first pass region of the substrate; and
   second wiring lines extending from the slimming region to the second pass region, and electrically coupling remaining word lines, other than the some word lines, with pass transistors formed in the second pass region of the substrate.

2. The three-dimensional nonvolatile memory device according to claim 1, wherein the cell region, the first pass region, the slimming region, and the second pass region are arranged along a first direction, and each of the first and second wiring lines is in the shape of a line and extends in the first direction.

3. The three-dimensional nonvolatile memory device according to claim 1, wherein each of the second wiring lines has a same width as each of the first wiring lines, and each of spaces between the adjacent second wiring lines has a same width as each of spaces between the adjacent first wiring lines.

4. The three-dimensional nonvolatile memory device according to claim 1, wherein the first wiring lines and the second wiring lines are disposed on the same layer.

5. The three-dimensional nonvolatile memory device according to claim 1, wherein the number of first wiring lines is equal to the number of second wiring lines or is different from the number of second wiring lines by one.

6. The three-dimensional nonvolatile memory device according to claim 1, wherein each of the word lines includes a pad portion which is a top portion of the word line that is not covered by any word lines above said word line, and said word line's top portion is exposed in the slimming region.

7. The three-dimensional nonvolatile memory device according to claim 6, further comprising:
   first contact plugs formed in the first pass region in a direction perpendicular to a top surface of the substrate, and electrically coupling sources of the pass transistors formed in the first pass region with the first wiring lines;
   second contact plugs formed in the slimming region in the direction perpendicular to the top surface of the substrate, and electrically coupling the pad portions of the some word lines with the first wiring lines;
   third contact plugs formed in the second pass region in the direction perpendicular to the top surface of the substrate, and electrically coupling sources of the pass transistors formed in the second pass region with the second wiring lines; and
   fourth contact plugs formed in the slimming region in the direction perpendicular to the top surface of the substrate, and electrically coupling the pad portions of the remaining word lines with the second wiring lines.

8. The three-dimensional nonvolatile memory device according to claim 7, wherein the word line stack includes a plurality of through holes, each corresponding to one of the first contact plugs in the first pass region, and the first contact plugs are disposed in the through holes.

9. The three-dimensional nonvolatile memory device according to claim 7, wherein the word line stack includes in a side surface thereof a plurality of recesses, each corresponding to one of the first contact plugs in the first pass region, and the first contact plugs are disposed in the recesses.

10. The three-dimensional nonvolatile memory device according to claim 7, wherein the word line stack includes in a side surface thereof a recess corresponding to the first pass region, and the first contact plugs are disposed in the recess.

11. The three-dimensional nonvolatile memory device according to claim 1, wherein the first wiring lines and the second wiring lines are respectively paired with each other, and each pair of the first and second wiring lines is disposed on the same line.

12. The three-dimensional nonvolatile memory device according to claim 1, further comprising:
   a first interlayer dielectric layer formed over the cell region, the first and second pass regions and the slimming region of the substrate and configured to cover the pass transistors, wherein the word line stack is disposed over the first interlayer dielectric layer.

13. The three-dimensional nonvolatile memory device according to claim 12, further comprising:

a second interlayer dielectric layer formed over the first interlayer dielectric layer and configured to cover the word line stack, wherein the first and second wiring lines are disposed over the second interlayer dielectric layer.

14. A three-dimensional nonvolatile memory device comprising:

pass transistors formed in a first pass region and a second pass region of a substrate on both sides of a slimming region;

a plurality of word lines stacked over the slimming region, the first pass region, and a cell region adjacent to the slimming region with the first pass region interposed therebetween, each of the word lines including a pad portion exposed upward from the word line stack in the slimming region;

first wiring lines extending from the slimming region to the first pass region and electrically coupling the pad portions of some word lines with the pass transistors of the first pass region; and second wiring lines extending from the slimming region to the second pass region and electrically coupling the pad portions of remaining word lines, other than the some word lines, with the pass transistors of the second pass region.

15. The three-dimensional nonvolatile memory device according to claim 14, further comprising:

first contact plugs formed in the first pass region in a direction perpendicular to a top surface of the substrate and coupling sources of the pass transistors formed in the first pass region with the first wiring lines;

second contact plugs formed in the slimming region in the direction perpendicular to the top surface of the substrate and coupling the pad portions of the some word lines with the first wiring lines;

third contact plugs formed in the second pass region in the direction perpendicular to the top surface of the substrate and coupling sources of the pass transistors formed in the second pass region with the second wiring lines; and fourth contact plugs formed in the slimming region in the direction perpendicular to the top surface of the substrate and coupling the pad portions of the remaining word lines with the second wiring lines.

16. The three-dimensional nonvolatile memory device according to claim 14, wherein the first pass region, the slimming region, and the second pass region are arranged along a first direction, and each of the first and second wiring lines is in a shape of a line and extends in the first direction.

17. The three-dimensional nonvolatile memory device according to claim 14, wherein the first wiring lines and the second wiring lines are disposed on the same layer.

18. The three-dimensional nonvolatile memory device according to claim 14, wherein the number of first wiring lines is equal to the number of second wiring lines or is different from the number of second wiring lines by one.

19. The three-dimensional nonvolatile memory device according to claim 14, wherein the first wiring lines and the second wiring lines are respectively paired with each other, and each pair of the first and second wiring lines is disposed on the same line.

20. A memory system comprising:

a memory controller; and a nonvolatile memory device, wherein the nonvolatile memory device further comprising:

a substrate defined with a slimming region, first and second pass regions on both sides of the slimming region, and a cell region adjacent to the slimming region with the first pass region interposed therebetween;

a word line stack including a plurality of word lines stacked over the cell region, the first pass region and the slimming region of the substrate;

first wiring lines extending from the slimming region to the first pass region, and electrically coupling some word lines with pass transistors formed in the first pass region of the substrate; and second wiring lines extending from the slimming region to the second pass region, and electrically coupling remaining word lines, other than the some word lines, with pass transistors formed in the second pass region of the substrate.

* * * * *